(12) United States Patent
Chiang et al.

(10) Patent No.: US 9,711,611 B2
(45) Date of Patent: Jul. 18, 2017

(54) MODIFIED SELF-ALIGNED CONTACT PROCESS AND SEMICONDUCTOR DEVICE

(71) Applicant: TAIWAN SEMICONDUCTOR MANUFACTURING CO., LTD., Hsinchu (TW)

(72) Inventors: Tsung-Yu Chiang, New Taipei (TW); Wei-Shuo Ho, New Taipei (TW); Kuang-Hsin Chen, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/083,383

(22) Filed: Mar. 29, 2016

(65) Prior Publication Data

US 2016/0211344 A1   Jul. 21, 2016

Related U.S. Application Data

(62) Division of application No. 14/175,523, filed on Feb. 7, 2014, now Pat. No. 9,324,577.

(51) Int. Cl.
*H01L 29/49* (2006.01)
*H01L 21/3213* (2006.01)
*H01L 21/321* (2006.01)
*H01L 21/3105* (2006.01)
*H01L 29/66* (2006.01)
(Continued)

(52) U.S. Cl.
CPC .... *H01L 29/4966* (2013.01); *H01L 21/31053* (2013.01); *H01L 21/321* (2013.01); *H01L 21/32133* (2013.01); *H01L 21/32138* (2013.01); *H01L 29/66545* (2013.01);
(Continued)

(58) Field of Classification Search
CPC .......... H01L 29/4966; H01L 21/32138; H01L 21/321; H01L 29/4958; H01L 29/51; H01L 29/517; H01L 29/518; H01L 29/6656
See application file for complete search history.

(56) References Cited

U.S. PATENT DOCUMENTS

| | | | |
|---|---|---|---|
| 7,968,395 B2 | 6/2011 | Rahhal-Orabi | |
| 2013/0334690 A1* | 12/2013 | Tsai | H01L 21/28088 257/751 |

(Continued)

OTHER PUBLICATIONS

Notice of Allowance U.S. Appl. No. 14/175,523 dated Dec. 24, 2015.

*Primary Examiner* — Shaun Campbell
*Assistant Examiner* — Aaron Dehne
(74) *Attorney, Agent, or Firm* — McDermott Will & Emery LLP

(57) ABSTRACT

A semiconductor device includes a transistor and a contact pad over a substrate. The transistor includes a high-k dielectric layer, a work function metal layer, a metal gate, two spacers, a metal compound, an insulator and a doped region. The high-k dielectric layer is over the substrate. The work function metal layer is over the high-k dielectric layer. The metal gate is over the work function metal layer. The two spacers sandwich the work function metal layer and the metal gate. The metal compound is over inner walls of the two spacers and over the top surface of the work function metal layer and the metal gate. The insulator covers the metal compound. The doped region is in the substrate. The contact pad is electrically connected to the metal gate.

20 Claims, 6 Drawing Sheets

(51) Int. Cl.
*H01L 29/423* (2006.01)
*H01L 29/51* (2006.01)
*H01L 21/768* (2006.01)

(52) U.S. Cl.
CPC .. *H01L 21/76897* (2013.01); *H01L 29/42376* (2013.01); *H01L 29/517* (2013.01)

(56) References Cited

U.S. PATENT DOCUMENTS

| | | | |
|---|---|---|---|
| 2014/0103403 A1* | 4/2014 | Kim | H01L 21/76801 257/288 |
| 2014/0154877 A1* | 6/2014 | Besser | H01L 29/4966 438/586 |
| 2015/0097252 A1* | 4/2015 | Flachowsky | H01L 29/517 257/410 |

* cited by examiner

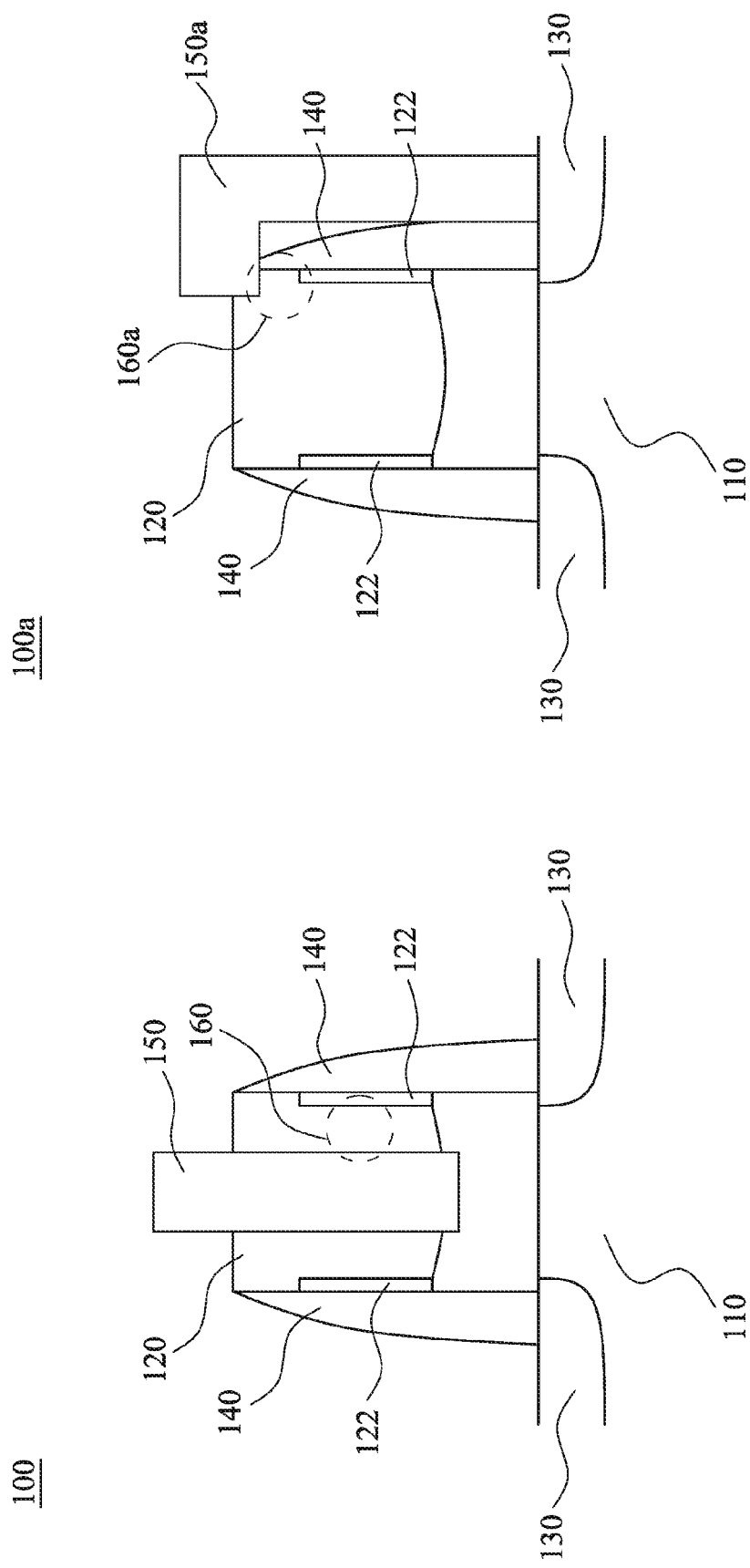

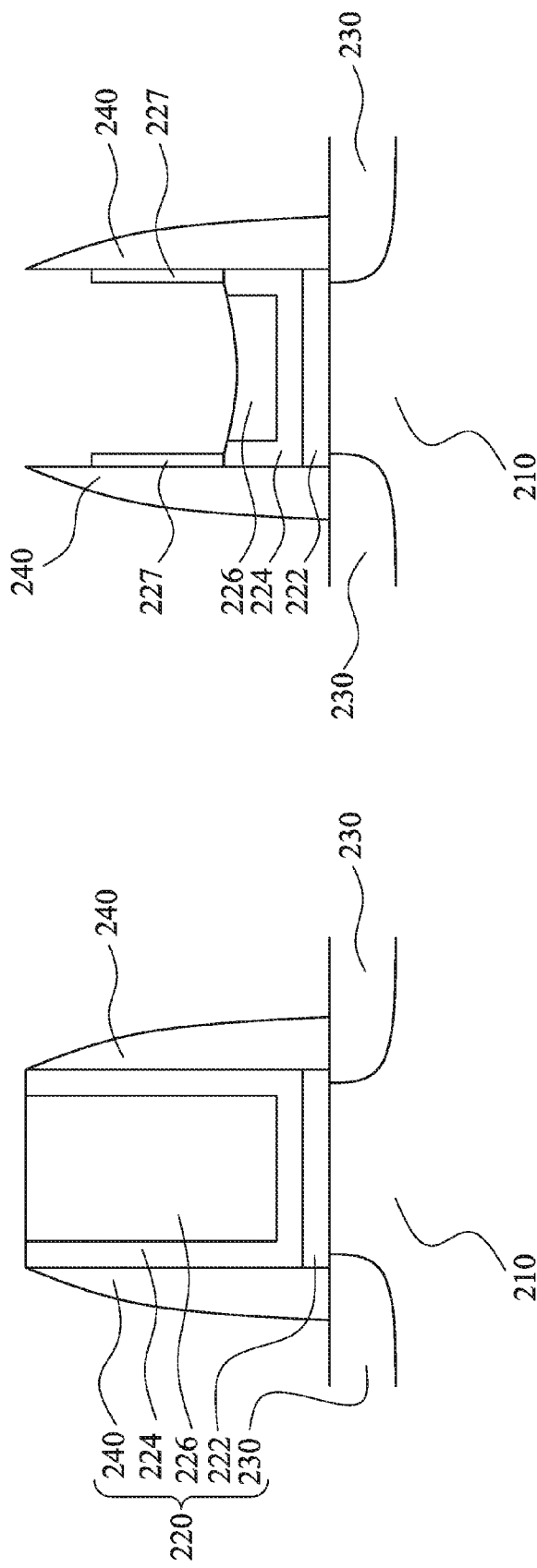

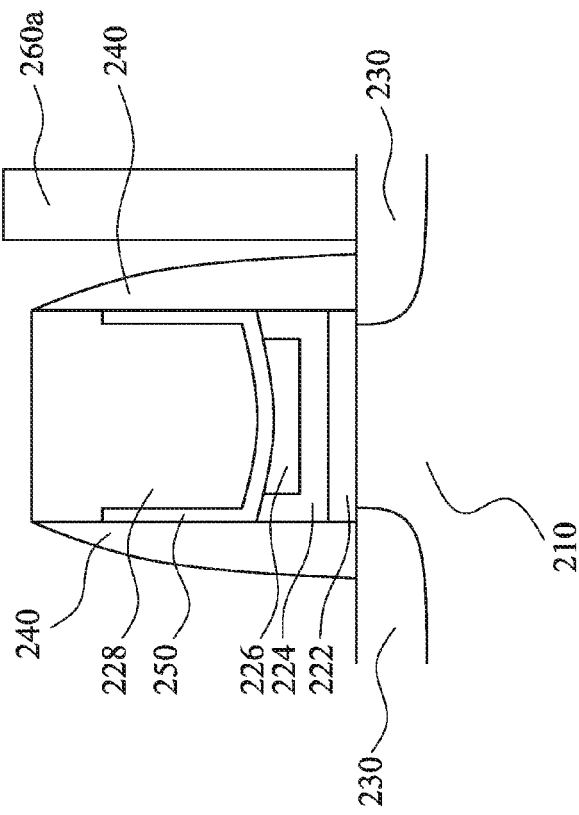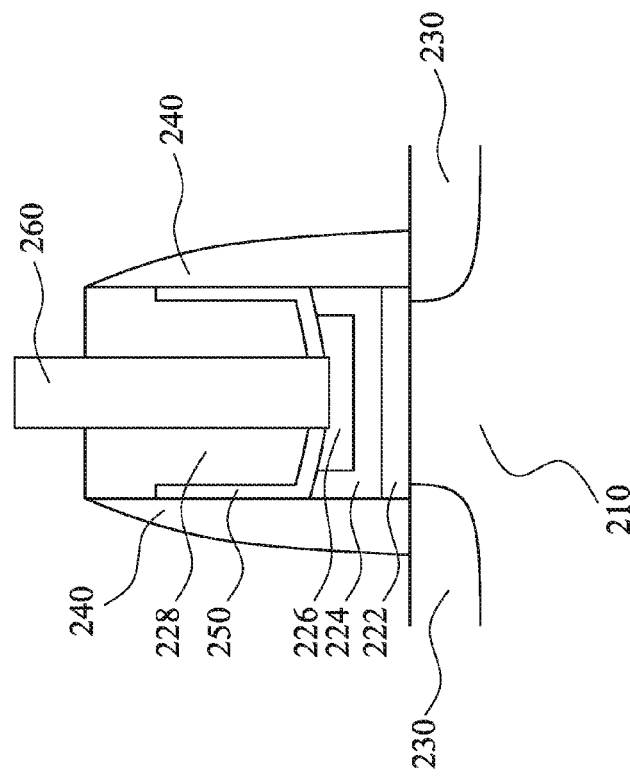

MODIFIED SELF-ALIGNED CONTACT PROCESS AND SEMICONDUCTOR DEVICE

CROSS-REFERENCE TO RELATED APPLICATION

The present application is a divisional of U.S. application Ser. No. 14/175,523, filed on Feb. 7, 2014, the disclosure of which are hereby incorporated by reference herein in its entirely.

BACKGROUND

Modern integrated circuits (ICs) contain millions of individual elements that are formed by patterning the materials, such as silicon, metal and/or dielectric layers. A set of processing steps is performed on a semiconductor wafer to from the circuit elements. For example, in lithography process, a process layer is formed on the semiconductor wafer, and a photoresist pattern then formed on the process layer by performing known photolithography techniques. In the fabrication of a semiconductor device, its patterns are fabricated in various planes. A semiconductor device is completed with a plurality of planes on which the individual patterns of the elements are located. The orientation of each plane with respect to one another is of considerable importance. If a plane was shifted too much with respect to a previous or subsequent plane, this could result in an interruption of the connection between the elements in one plane and the next.

In order to integrate increasing numbers of the circuit elements onto an IC, it has been necessarily to reduce the dimensions of the circuit elements; however, the critical dimensions (CDs) of the elements decrease accordingly. The CD refers to the smallest width of a connecting line or the smallest space between two lines permitted in the fabrication of a semiconductor device, which is used to monitor the pattern accuracy of the semiconductor device. Scaling-down the pitch of a gate in a semiconductor device decreases the space between features of the element, e.g., the gate electrode and the doped region of a transistor, and there might be no overlay window, which has a high risk of short circuits. The smaller the CD of a semiconductor device is, the less the CD variation is allowed. Moreover, as the dimension of the electronic device decreases, the complexity of processing and fabricating semiconductor devices is increased, and the probability of misalignment is also increased.

A self-aligned contact (SAC) process is developed to more reliably fabricate smaller semiconductor device structures at higher density. The SAC process includes forming an insulating layer covering an etched gate electrode. However, a high risk of short circuits occurs between the gate electrode and a contact pad induced by a metal residue due to CD variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view of a semiconductor device fabricated by conventional SAC process.

FIG. 1B is a cross-sectional view of another semiconductor device fabricated by conventional SAC process.

FIGS. 2A through 2F are cross-sectional views at various stages of fabricating a semiconductor device in accordance with some embodiments in the present disclosure.

DETAILED DESCRIPTION

Figure 2C:
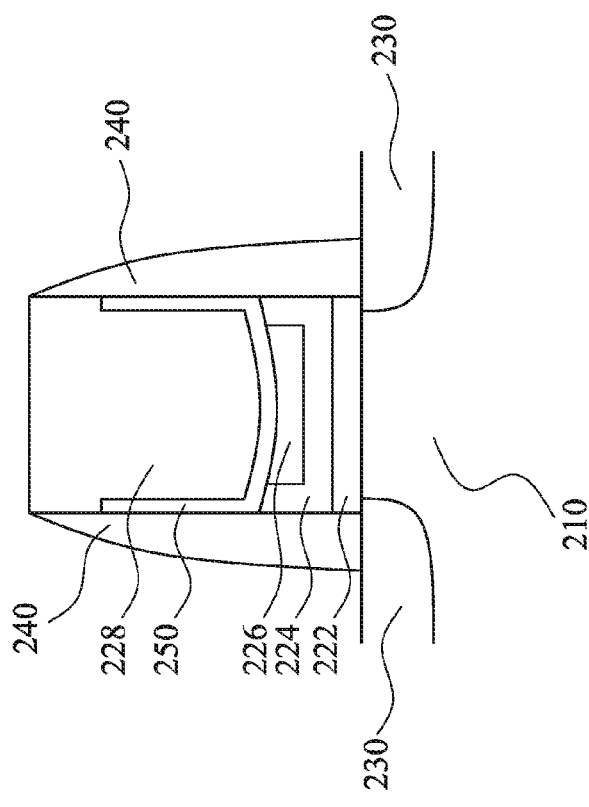

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A shows a semiconductor device 100 fabricated by conventional self-aligned contact (SAC) process. A metal residue 122 is left on the inner walls of two spacers 140 of a gate electrode 120 during the etching in the SAC process. A contact pad 150 is formed electrically connected to the gate electrode 120. As the dimensions of the electronic devices decrease, the contact pad 150 may be close to the metal residue 122 on the sidewalls of the two spacers 140, which may induce short circuits between the gate electrode 120 and the contact pad 150 (i.e., region 160).

FIG. 1B shows another semiconductor device 100a fabricated by conventional SAC process. A contact pad 150a is formed electrically connected to a doped region 130. As the dimensions of the electronic devices decrease, the space between a gate electrode 120 and doped regions 130 decreases to increase density of elements, such that the contact pad 150a may overlap the gate electrode 120, and thus the metal residue 122 on the sidewalls of the spacers 140 may induce short circuits between the gate electrode 120 and the contact pad 150a (i.e., region 160a).

In order to solve the above-mentioned problems, the present disclosure provides a method for modifying a SAC process in a semiconductor fabrication, which scales down the dimensions of electronic devices while preventing the risk of short circuits.

FIGS. 2A through 2F are cross-sectional views at various stages of fabricating a semiconductor device in accordance with one embodiment in the present disclosure.

Referring to FIG. 2A, a transistor 220 is formed over a substrate 210, wherein the transistor 220 includes a high-k dielectric layer 222 over the substrate 210, a work function metal layer 224 over the high-k dielectric layer 222, a metal gate 226 over the work function metal layer 224, two spacers 240 sandwiching the work function metal layer 224 and the metal gate 226, and doped regions 230 in the substrate 210.

The work function metal layer 224 may includes a layer or layers of metal having desired functions.

In one embodiment, forming the transistor over the substrate includes providing a substrate having doped regions in the substrate; forming a dummy gate over the substrate; depositing an interlayer dielectric layer covering the substrate; polishing the interlayer dielectric layer to expose the top surface of the dummy gate; removing the dummy gate to expose a portion of the substrate; depositing a high-k dielectric layer over the portion of the substrate; depositing a work function metal layer over the high-k metal gate layer; and forming a metal gate over the work function metal layer.

Referring to FIG. 2B, a portion of the work function metal layer 224 and the metal gate 226 are etched to leave a metal residue 227. The metal residue 227 is left by sputtering of the work function metal layer 224 and/or the metal gate 226 during the etching of the work function metal layer 224 and the metal gate 226. Thus, the metal residue 227 may not be a layer of metal having a uniform thickness. A patterned mask (not shown) may be formed to expose the top surface of the work metal layer 224 and the metal gate 226 before etching the work metal layer 224 and the metal gate 226.

Referring to FIG. 2C, the metal residue 227 is modified to form a metal compound 250.

In one embodiment, etching a portion of the work function metal layer 224 and the metal gate 226 to leave a metal residue 227 is to leave the metal residue 227 over inner walls of the two spacers 240 exposing the work function metal layer 224 and the metal gate 226. Then, the metal residue 227, the exposed work function metal layer 224, and the exposed metal gate 226 are modified to form a metal compound 250. The metal residue 227, the exposed work function metal layer 224, and the exposed metal gate 226 may be modified by oxygen, ammonia, nitrous oxide, nitrogen, or combinations thereof. The metal compound 250 may be a metal oxide and/or a metal nitride by oxidizing and/or nitrogenizing the metal residue 227, the exposed work function metal layer 224, and the exposed metal gate 226. The modification of the metal residue 227 may be performed under a power of about 100 watts to 500 watts. Because the metal residue 227 may not be a layer of metal having a uniform thickness, the metal compound 250, which is modified from the metal residue 227, the exposed work function metal layer 224, and the exposed metal gate 226, may also not be a layer of metal having a uniform thickness.

In another embodiment, etching a portion of the work function metal layer 224 and the metal gate 226 to leave a metal residue 227 is to leave the metal residue 227 over inner walls of the two spacers 240 and over the top surface of the work function metal layer 224 and the metal gate 226. Then, the metal residue 227 is modified to form a metal compound 250. The metal residue 227 may be modified by oxygen, ammonia, nitrous oxide, nitrogen, or combinations thereof. The metal compound 250 may be a metal oxide and/or a metal nitride by oxidizing and/or nitrogenizing the metal residue 227. The modification of the metal residue 227 may be performed under a power of about 100 watts to 500 watts. Because the metal residue 227 may not be a layer of metal having a uniform thickness, the metal compound 250, which is modified from the metal residue 227, may also not be a layer of metal having a uniform thickness.

Figure 2D:
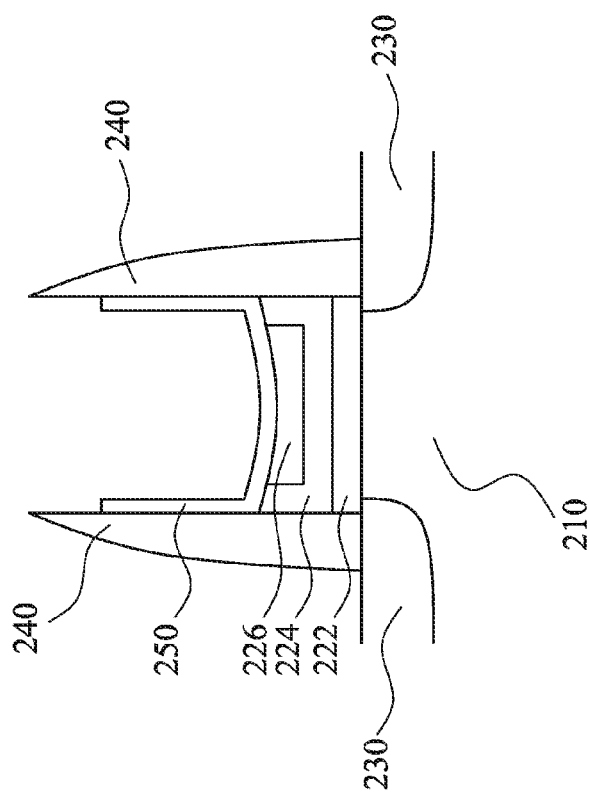

Referring to FIG. 2D, an insulator 228 is deposited to cover the metal compound 250. In one embodiment, the insulator 228 is polished after the deposition. The insulator 228 may be polished by chemical mechanical polishing (CMP) process.

Referring to FIGS. 2E and 2F, contact pads 260, 260a are formed respectively electrically connected to the metal gate 226 and the doped region 230. In one embodiment, forming the contact pad 260 respectively electrically connected to the metal gate 226 and the doped region 230 further includes etching the metal compound 250 to expose the metal gate 226.

FIG. 2E is a cross-sectional view of a semiconductor device 200 in accordance with an embodiment in the present disclosure. The semiconductor device 200 includes a high-k dielectric layer 222 over the substrate 210, a work function metal layer 224 over the high-k dielectric layer 222, a metal gate 226 over the work function metal layer 224, two spacers 240 sandwiching the work function metal layer 224 and the metal gate 226, a metal compound 250 over inner walls of the two spacers 240 and over the top surface of the work function metal layer 224 and the metal gate 226, an insulator 228 covering the metal compound 250, and doped regions 230 in the substrate 210, and a contact pad 260 electrically connected to the metal gate 226. The metal compound 250 may be a metal oxide, a metal nitride, or combinations thereof. The metal compound 250 may be $Al_xO_y$, $Ti_xO_y$, $W_xO_y$, $Ta_xO_y$, $Ti_xO_yN_z$, $Ta_xAl_yO_z$, $Ti_xAl_yO_z$, $Al_xN_y$, $Ti_xN_y$, $W_xN_y$, $Ta_xN_y$, $Ta_xAl_yN_z$, $Ti_xAl_yN_z$, or combinations thereof, wherein x, y and z are positive numbers. The metal compound 250 may not be a layer of metal, and have an average thickness in a range from about 1 nm to about 3 nm. In this embodiment, the metal compound 250 has an opening exposing the metal gate 226 to electrically connect to the contact pad 260.

If a contact pad electrically connected to the metal gate in a semiconductor device fabricated by conventional SAC process is close to the metal gate, short circuits might occur between the contact pad and the metal gate as the region 160 shown in FIG. 1A induced by metal residue 122. The formation of the metal compound 250 prevents the short circuits between the metal gate 226 and the contact pad 260. Without the risk of short circuits, the pitch of a gate in a semiconductor device may be scaled down, and the window where short circuits might occur may be enlarged.

FIG. 2F is a cross-sectional view of a semiconductor device 200a, wherein the difference between the embodiments shown in FIG. 2E and FIG. 2F is that the contact pad 260a electrically connects to the doped region 230. The semiconductor device 200a is formed subsequently in the process of fabricating the semiconductor device 200 in accordance with an embodiment in the present disclosure.

Figure 3:
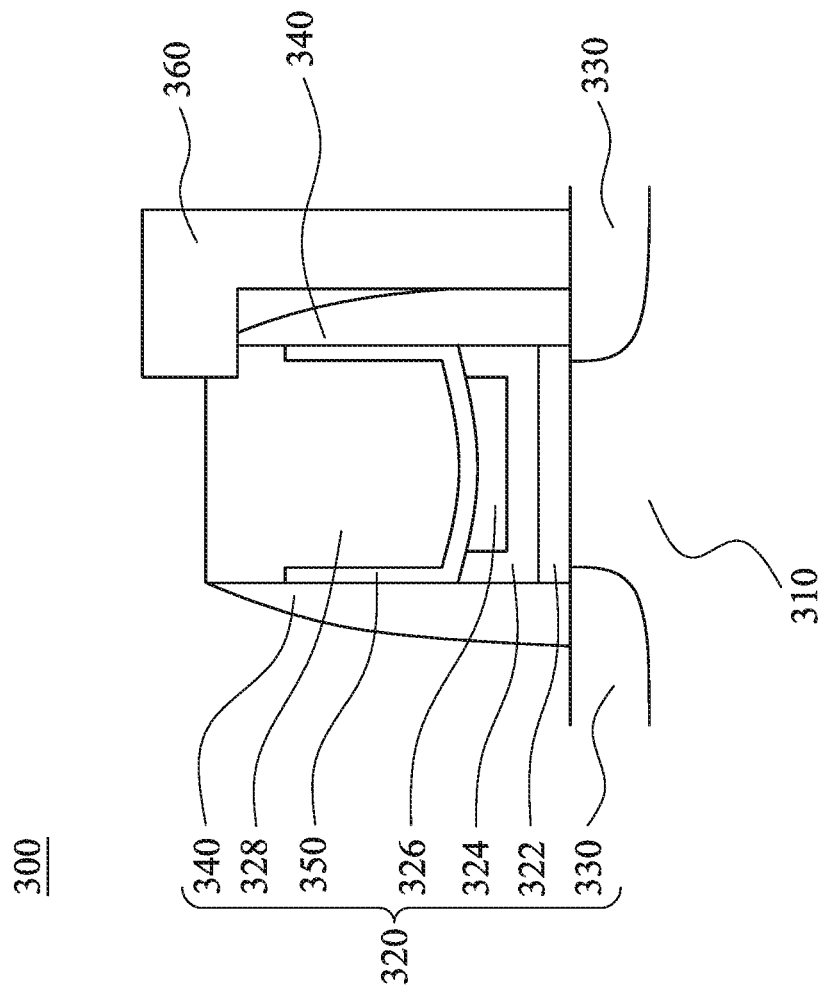
FIG. 3 is a cross-sectional view of a semiconductor device in accordance with some embodiments in the present disclosure.

FIG. 3 is a cross-sectional view of a semiconductor device 300 in accordance with another embodiment in the present disclosure. The semiconductor device 300 may be fabricated using a method similar to that described above with reference to FIGS. 2A-2F. The semiconductor device 300 includes a transistor 320 thereon and contact pad 360, wherein the transistor 320 includes a high-k dielectric layer 322 over the substrate 310, a work function metal layer 324 over the high-k dielectric layer 322, a metal gate 326 over the work function metal layer 324, two spacers 340 sandwiching the work function metal layer 324 and the metal gate 326, a metal compound 350 over inner walls of the two spacers 340 and over the top surface of the work function metal layer 324 and the metal gate 326, an insulator 328 covering the metal compound 350, and doped regions 330 in the substrate 310. The contact pad 360 electrically connected to the doped region 330. The metal compound 350 may be a metal oxide, a metal nitride, or combinations thereof. The metal compound 350 may be $Al_xO_y$, $Ti_xO_y$, $W_xO_y$, $Ta_xO_y$, $Ti_xO_yN_z$, $Ta_xAl_yO_z$, $Ti_xAl_yO_z$, $Al_xN_y$, $Ti_xN_y$, $W_xN_y$, $Ta_xN_y$, Ta$_x$Al$_y$N$_z$, Ti$_x$Al$_y$N$_z$, or combinations thereof, wherein x, y and z are positive numbers. The metal compound 350 may not be a layer of metal, and have an average thickness in a range from about 1 nm to about 3 nm.

The difference between the embodiments shown in FIG. 2F and FIG. 3 is that as the dimension of the electronic devices decrease, the space between the metal gate 326 and the doped region 330 decreases to increase the density of elements, such that the contact pad 360 electrically connected to the doped region 330 overlaps the insulator 328. If a contact pad electrically connected to a doped region in a semiconductor device fabricated by conventional SAC process overlaps an insulator, short circuits might occur between the contact pad and the metal gate as the region 160a shown in FIG. 1B induced by metal residue 122. The formation of the metal compound 350 prevents the short circuits between the metal gate 326 and the contact pad 360 connected to the doped region 330. Without the risk of short circuits, the space between the metal gate 326 and the doped regions 330 may be scaled down, the window where short circuits might occur may be enlarged, and the contact window of the contact pad 360 may be enlarged by overlaying the insulator 328. In one embodiment, the minimum distance between the metal gate 326 and the contact pad 360 of the doped region 330 is about 8 nm. In comparison, the semiconductor device fabricated by conventional SAC process has a minimum distance between the metal gate and the contact pad of the doped region of about 16 nm.

Figure 4:
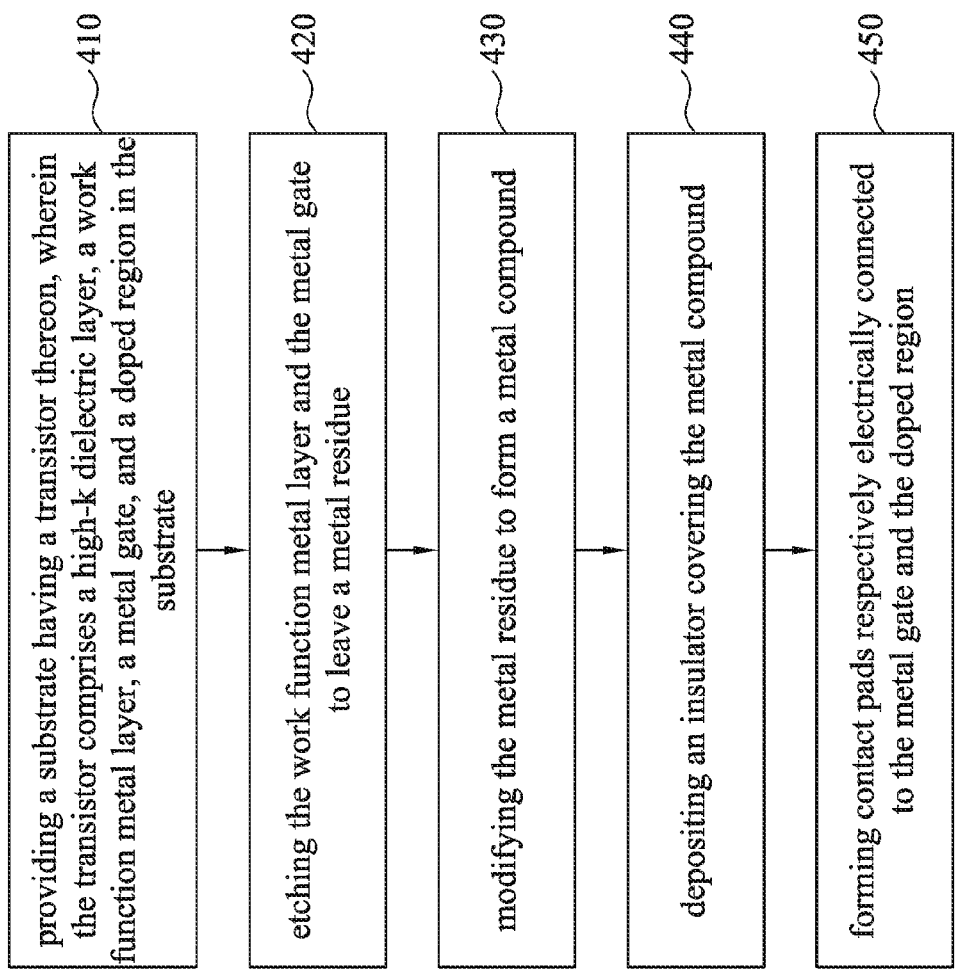
FIG. 4 is a flow chart illustrating a method for fabricating a semiconductor device in accordance with some embodiments of the present disclosure.

FIG. 4 is a method for modifying a SAC process in a semiconductor fabrication in accordance with various embodiments of the present disclosure. In operation 410, a substrate having a transistor thereon is provided, wherein the transistor includes a high-k dielectric layer, a work function metal layer, a metal gate, and a doped region in the substrate, as shown in FIG. 2A.

Still referring to FIG. 4, in operation 420, the work function metal layer and the metal gate are etched to leave a metal residue, as shown in FIG. 2B.

In operation 430, the metal residue is modified to form a metal compound, as shown in FIG. 2C.

In operation 440, an insulator is deposited to cover the metal compound, as shown in FIG. 2D.

In operation 450, contact pads are formed respectively electrically connected to the metal gate and the doped region. The contact pad may be formed electrically connected to the metal gate, as shown in FIG. 2E. The contact pad may be formed electrically connected to the doped region, as shown in FIG. 2F or FIG. 3.

It is noteworthy that the method for modifying a SAC process in a semiconductor fabrication of the present disclosure may be applied in fin field-effect transistor (FinFET). The cross-sectional view of a semiconductor device using FinFET having a contact pad electrically connected to a metal gate may not include doped regions.

The embodiments of the present disclosure discussed above have advantages over exiting methods and systems. Because of the modified self-aligned contact process by adding oxygen and/or nitrogen treatment for metal residue, the short circuits between a gate electrode and contact pads are prevented. Thus, the metal gate to the contact pad short window and the contact overlay window are enlarged, and the device density is increased by scaling down the pitch of a gate in a semiconductor device and the space between the gate electrode and the contact pad of the doped region. It is understood, however, that other embodiments may have different advantages, and that no particular advantages is required for all embodiments.

Thus, it will be appreciated that described herein is an embodiment of a method of modifying a self-aligned contact process in a semiconductor fabrication, including forming a transistor over a substrate, wherein forming the transistor over the substrate includes depositing a high-k dielectric layer over the substrate; depositing a work function metal layer over the high-k dielectric layer; forming a metal gate over the work function metal layer; forming two spacers sandwiching the work function metal layer and the metal gate; and forming a doped region in the substrate. The method continues to include etching a portion of the work function metal layer and the metal gate to leave a metal residue over inner walls of the two spacers exposing the work function metal layer and the metal gate; modifying the metal residue and the exposed work function metal layer and metal gate to form a metal compound; depositing an insulator covering the metal compound; and forming contact pads respectively electrically connected to the metal gate and the doped region.

In accordance with another embodiment, the present disclosure disclosed a method of modifying a self-aligned contact process in a semiconductor fabrication, including forming a transistor over a substrate, wherein forming the transistor over the substrate includes depositing a high-k dielectric layer over the substrate; depositing a work function metal layer over the high-k dielectric layer; forming a metal gate over the work function metal layer; forming two spacers sandwiching the work function metal layer and the metal gate; and forming a doped region in the substrate. The method continues to include etching a portion of the work function metal layer and the metal gate to leave a metal residue over inner walls of the two spacers and over the top surface of the work function metal layer and the metal gate; modifying the metal residue to form a metal compound; depositing an insulator covering the metal compound; and forming contact pads respectively electrically connected to the metal gate and the doped region.

In accordance with yet another embodiment, the present disclosure disclosed a semiconductor device, including a substrate having a transistor thereon and contact pads, wherein the transistor includes a high-k dielectric layer over the substrate; a work function metal layer over the high-k dielectric layer; a metal gate over the work function metal layer; two spacers sandwiching the work function metal layer and the metal gate; a metal compound over inner walls of the two spacers and over the top surface of the work function metal layer and the metal gate; an insulator covering the metal compound; and a doped region in the substrate. The contact pads respectively electrically connect to the metal gate and the doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate having a transistor thereon, wherein the transistor comprises:

a high-k dielectric layer over the substrate;
a work function metal layer over the high-k dielectric layer;
a metal gate over the work function metal layer;
two spacers sandwiching the work function metal layer and the metal gate;
a metal compound over inner walls of the two spacers and over a top surface of the work function metal layer and the metal gate;
an electrical insulator fully contacting all surfaces of the metal compound except for remaining surfaces of the metal compound contacted by the inner walls of the two spacers and the top surface of the work function metal layer and the metal gate;
a doped region in the substrate; and
a contact pad electrically connected to the metal gate.

2. The semiconductor device of claim 1, wherein the metal compound is a metal oxide, a metal nitride, or combinations thereof.

3. The semiconductor device of claim 2, wherein the metal oxide is $Al_xO_y$, $Ti_xO_y$, $W_xO_y$, $Ta_xO_y$, $Ti_xO_yN_z$, $Ta_xAl_yO_z$, $Ti_xAl_yO_z$, or combinations thereof, wherein x, y and z are positive numbers.

4. The semiconductor device of claim 2, wherein the metal nitride is $Ti_xO_yN_z$, $Al_xN_y$, $Ti_xN_y$, $W_xN_y$, $Ta_xN_y$, $Ta_xAl_yN_z$, $Ti_xAl_yN_z$, or combinations thereof, wherein x, y and z are positive numbers.

5. The semiconductor device of claim 1, wherein the metal compound has an average thickness in a range from about 1 nm to about 3 nm.

6. The semiconductor device of claim 1, wherein the metal compound has an opening exposing the metal gate to electrically connect to the contact pad.

7. The semiconductor device of claim 1, wherein the metal compound is not a metal layer.

8. A semiconductor device comprising:
a substrate having a transistor thereon, wherein the transistor comprises:
a high-k dielectric layer over the substrate;
a work function metal layer over the high-k dielectric layer;
a metal gate over the work function metal layer;
two spacers sandwiching the work function metal layer and the metal gate;
a metal compound over inner walls of the two spacers and over a top surface of the work function metal layer and the metal gate;
an electrical insulator fully contacting all surfaces of the metal compound except for remaining surfaces of the metal compound contacted by the inner walls of the two spacers and the top surface of the work function metal layer and the metal gate;
a doped region in the substrate; and
a contact pad electrically connected to the doped region.

9. The semiconductor device of claim 8, wherein the metal compound is a metal oxide, a metal nitride, or combinations thereof.

10. The semiconductor device of claim 9, wherein the metal oxide is $Al_xO_y$, $Ti_xO_y$, $W_xO_y$, $Ta_xO_y$, $Ti_xO_yN_z$, $Ta_xAl_yO_z$, $Ti_xAl_yO_z$, or combinations thereof, wherein x, y and z are positive numbers.

11. The semiconductor device of claim 9, wherein the metal nitride is $Ti_xO_yN_z$, $Al_xN_y$, $Ti_xN_y$, $W_xN_y$, $Ta_xN_y$, $Ta_xAl_yN_z$, $Ti_xAl_yN_z$, or combinations thereof, wherein x, y and z are positive numbers.

12. The semiconductor device of claim 8, wherein the metal compound has an average thickness in a range from about 1 nm to about 3 nm.

13. The semiconductor device of claim 8, wherein the metal compound is not a metal layer.

14. A semiconductor device comprising:
a substrate having a transistor thereon, wherein the transistor comprises:
a high-k dielectric layer over the substrate;
a work function metal layer over the high-k dielectric layer;
a metal gate over the work function metal layer;
two spacers sandwiching the work function metal layer and the metal gate;
a metal compound over inner walls of the two spacers and over a top surface of the work function metal layer and the metal gate;
an electrical insulator fully contacting all surfaces of the metal compound except for remaining surfaces of the metal compound contacted by the inner walls of the two spacers and the top surface of the work function metal layer and the metal gate;
a doped region in the substrate; and
a contact pad electrically connected to the doped region overlaps the insulator.

15. The semiconductor device of claim 14, wherein the metal compound is a metal oxide, a metal nitride, or combinations thereof.

16. The semiconductor device of claim 15, wherein the metal oxide is $Al_xO_y$, $Ti_xO_y$, $W_xO_y$, $Ta_xO_y$, $Ti_xO_yN_z$, $Ta_xAl_yO_z$, $Ti_xAl_yO_z$, or combinations thereof, wherein x, y and z are positive numbers.

17. The semiconductor device of claim 15, wherein the metal nitride is $Ti_xO_yN_z$, $Al_xN_y$, $Ti_xN_y$, $W_xN_y$, $Ta_xN_y$, $Ta_xAl_yN_z$, $Ti_xAl_yN_z$, or combinations thereof, wherein x, y and z are positive numbers.

18. The semiconductor device of claim 14, wherein the metal compound has an average thickness in a range from about 1 nm to about 3 nm.

19. The semiconductor device of claim 14, wherein the minimum distance between the metal gate and the contact pad is about 8 nm.

20. The semiconductor device of claim 14, wherein the metal compound is not a metal layer.

* * * * *